United States Patent [19]

Ohtaka et al.

[11] Patent Number: 5,196,354
[45] Date of Patent: Mar. 23, 1993

[54] METHOD OF MANUFACTURING SEMICONDUCTOR DEVICE WITH CONTROLLED CARRIER LIFETIME

[75] Inventors: Shigeo Ohtaka, Takasaki; Akio Andoo, Gunma; Tetsuo Iijima, Takasaki, all of Japan

[73] Assignee: Hitachi, Ltd., Tokyo, Japan

[21] Appl. No.: 582,583

[22] Filed: Sep. 14, 1990

[30] Foreign Application Priority Data

Sep. 18, 1989 [JP] Japan .................. 1-240167

[51] Int. Cl.$^5$ ............ H01L 21/31; H01L 21/76; H01L 21/78
[52] U.S. Cl. .................... 437/17; 437/240; 437/214; 437/215; 437/923; 437/247
[58] Field of Search ............. 437/225, 240, 17

[56] References Cited

FOREIGN PATENT DOCUMENTS 55-156343 12/1980 Japan .
62-219664 9/1987 Japan .

OTHER PUBLICATIONS

Ghandhi, "VLSI fabrication principles", John Wiley & Sons Inc., 1983 pp. 421–427.
Japanese Journal "Denshi Zairyo" (Material for Electronics), Dec. 1988, pp. 41–45, Kogyo-chosa-kai.
Japanese Journal "Denshi Zairyo" (Material for Electronics), Dec. 1988, pp. 46–52, Kogyo-chosa-kai.
R. Stengl and U. Gösele; Paper entitled "Variation of Lateral Doping—, A New Concept to Avoid High Voltage Breakdown of Planar Junctions," (1985) pp. 154–157, Siemens Research Labs, Germany.

Primary Examiner—Olik Chaudhuri
Assistant Examiner—Ourmazd S. Ojan
Attorney, Agent, or Firm—Pennie & Edmonds

[57] ABSTRACT

A semiconductor device has a semiconductor substrate, an insulated gate field-effect transistor section formed in the substrate and a peripheral section formed in the substrate and arranged to substantially surround the field-effect transistor section. A passivation layer of an organic material is provided over that part of the substrate in which the field-effect transistor section is not located. The device may be resin mold packaged for an enhanced humidity-resistance by making use of the fact tht the peripheral portion of the device is covered with organic resin.

8 Claims, 9 Drawing Sheets

METHOD OF MANUFACTURING SEMICONDUCTOR DEVICE WITH CONTROLLED CARRIER LIFETIME

BACKGROUND OF THE INVENTION

The present invention relates to semiconductor devices including insulated gate field-effect transistors (IG FET) and a manufacturing method of the same, and more particularly to a high speed switching IG FET. The present invention is effective in an application to a lifetime control technique of a built-in diode of an IG FET by the use of, for example, electron beam irradiation.

In a power MOSFET, the lifetime control is performed by diffusing a heavy metal or radiating an electron beam or a neutron beam in order to reduce reverse recovery time $t_{rr}$ of the built-in diode. For example, a technique of adjusting reverse recovery time of a built-in diode by applying electron beam irradiation and annealing treatment to a substrate in which a MOS semiconductor element is formed is disclosed in JP-A-62-219664 (laid open on Sep. 26, 1987).

A polyimide resin has less pin holes as compared with a phosphosilicate glass (PSG) film and can be formed thicker. Thus, the polyimide resin is considered to be suitable as a surface passivation film for α-ray resistant or high withstand breakdown voltage semiconductor elements, and is widely used not only for bipolar transistors, but also for insulated gate field-effect transistors, IC devices and the like. For example, a technique of coating a surface of a semiconductor chip with a polyimide resin for α-ray shielding is disclosed in JP-A-55-156343 (laid open on Dec. 5, 1980). Further, a new polyimide film for multilayer interconnection and polyimide resins for semiconductors are described in a Japanese journal "DENSHI ZAIRYO" ("Materials for Electronics") Dec. 1, 1988, published by Kogyo Chosakai, pp. 41–45 and pp. 46–52.

In reducing the reverse recovery time $t_{rr}$ in a built-in diode of a power IG FET (a power MOSFET), the life-time control by electron beam irradiation is performed. That is, with this technique, after a MOS transistor section including p-type wells is formed in an n-type semiconductor substrate, electron beam is radiated onto the transistor section and then annealing treatment is performed, thereby to reduce the reverse recovery time of junction diodes (built-in diodes) between an n-type substrate and a p-type wells, thus making it possible to utilize the built-in diode positively as a flywheel diode.

Further, as shown in FIG. 5 of the above-mentioned JP-A-62-219664, a threshold voltage $V_{th}$ of MOSFETs irradiated with an electron beam recovers approximately 80% at the maximum of $V_{th}$ of MOSFETs which are not irradiated with an electron beam. Furthermore, the rate of recovery of these values $V_{th}$ depends on the length and duration time of annealing treatment, and saturates in a predetermined treatment time at a fixed temperature. Thus, it will be possible to always obtain a maximal recovery rate by selecting the time for the annealing treatment.

On the other hand, a polyimide resin has been used for a passivation film and an inter-layer insulating film due to its superiority in the dielectric breakdown voltage (withstand voltage), alpha rays shielding effect, thick film formation, buffer performance and the like.

SUMMARY OF THE INVENTION

In view of the superiority of the polyimide resin, the present inventors have prepared a semiconductor device in which a polyimide resin is employed as the material for a surface passivation layer in place of phosphosilicate glass (PSG) in a power IG FET. The device has been subjected to a treatment for the lifetime control. According to the inventors' investigation, it has been found that, in an IG FET with a polyimide resin used as a passivation layer, the rate of recovery of the threshold voltage $V_{th}$ with annealing treatment after electron beam irradiation is as low as 50 to 68% as compared with 80 to 90% in the case of an IG FET employing a PSG passivation layer, and moreover, dispersion of the recovered threshold values are large.

Figure 1:
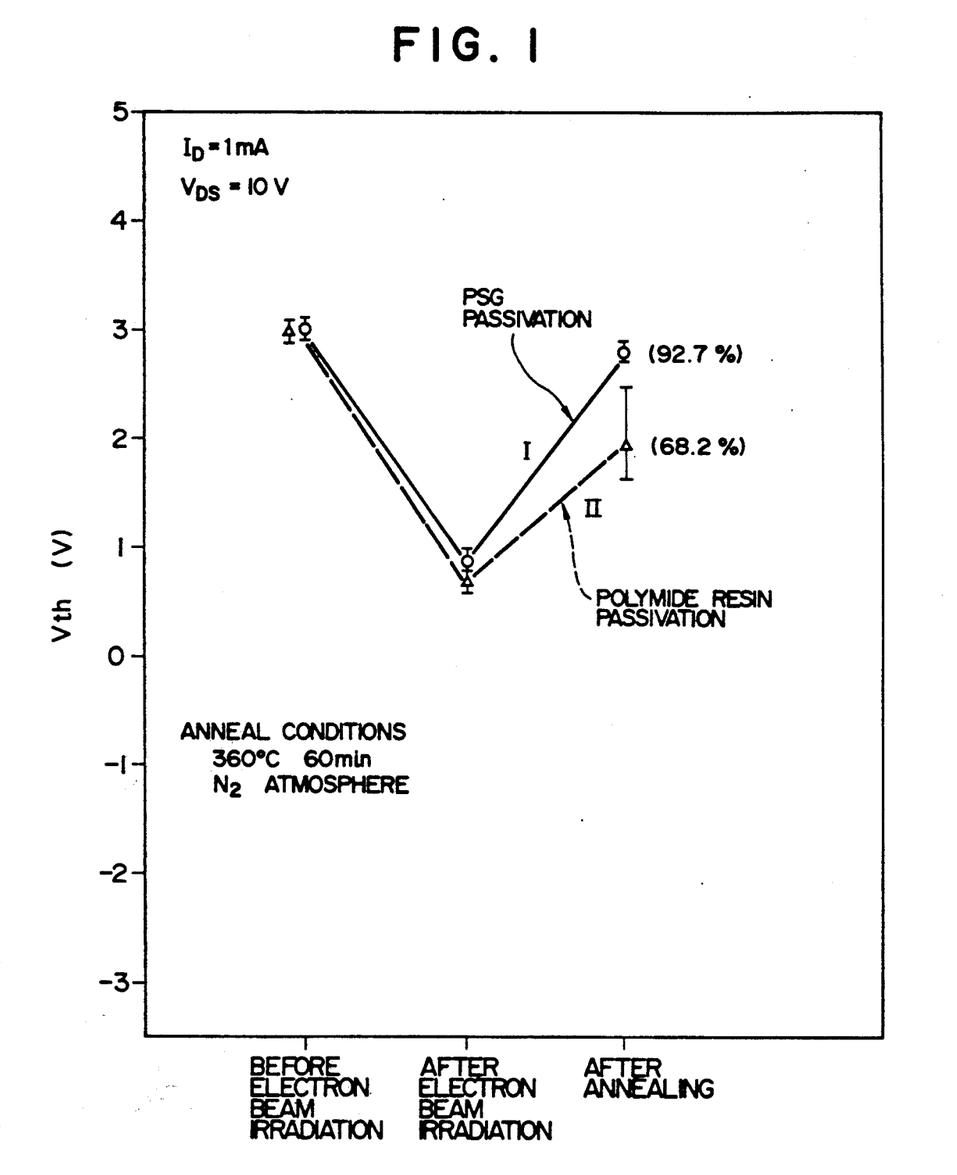
FIG. 1 is a graph of data obtained by the present inventors' experiments, showing recovery of threshold voltage values of PSG-passivated semiconductor devices and polyimide resin-passivated semiconductor devices by annealing.

FIG. 1 represents data obtained by the inventors' experiments, showing rates of recovery of the threshold voltages $V_{th}$, by annealing treatments in a $N_2$ atmospheres, of IG FETs having PSG surface passivation layers and IG FETs having polyimide surface passivation layers, both of the IG FETs with PSG surface passivation layers and the IG FETs with polyimide surface passivation layers having been subjected to electron beam irradiation treatment. Curve I denotes charges of the threshold voltages of FETs with PSG passivation, while curve II denotes changes of the threshold voltages of FETs with polyimide passivation. Annealing was effected for 60 minutes at a temperature of 360° C. in $N_2$ atmosphere.

Referring to FIG. 1, Curves I and II represent threshold voltages $V_{th}$ of FETs determined from gate-secure voltages exhibited by the FETs in which the drain current $I_D$ amounted to 1 mA with a drain-source voltage $V_{DS}$ of 10V applied. As can be seen from the curves shown in FIG. 1, FETs with polyimide passivation layers, which have been subjected to electron beam irradiation and annealing treatments, have threshold voltages of 2V or so and do not recover a desired threshold voltage of 3V.

It is an object of the present invention to provide a high breakdown voltage semiconductor device including an IG FET provided with an organic material passivation layer such as of a polyimide resin.

Another object of the present invention is to provide a method of manufacturing high breakdown voltage semiconductor devices mentioned above.

Another object of the present invention is to provide a semiconductor device in which a built-in diode has a shortened reverse recovery time and which has an IG FET with a polyimide resin passivation layer.

In accordance with an aspect of the present invention, a semiconductor device has a particular part of a passivation layer made of an organic material such as polyimide resin, and the reverse recovery time of a built-in diode is reduced or shortened by electron beam irradiation and an annealing treatment in the manufacture thereof. Furthermore, since the polyimide resin as said passivation layer is not satisfactory from the viewpoint of the recovery of the threshold voltage value of the IG FET by an annealing treatment, a polyimide resin layer is not provided in a region for an IG FET section and is provided in a peripheral section of the semiconductor device which substantially surrounds the IG FET section. The IG FET section, and other sections if necessary, are surface-protected by a passivation layer made of an in organic material such as phosphosilicate glass. Accordingly, when the surface of the semiconductor device is passivated such that passivation films composed of desired materials are formed in desired regions, respectively.

According to above-mentioned aspect of the present invention, polyimide resin may be provided in the peripheral portion of the surface of the semiconductor device. Thus, when the device is molded with resin, adhesion is made better because both are resins and moisture resistance will be improved. In addition, since the polyimide resin is not provided in the region for the IG FET section, the rate of recovery of the threshold voltage value of the IG FET by an annealing treatment is increased in the process of reducing the reverse recovery time of a built-in diode by means of electron beam irradiation and annealing treatment applied at the time of manufacture of semiconductor devices, thus making it possible to use the built-in diode as a flywheel diode. FETs may be, for example, determined as having been subjected to lifetime control treatments by measuring trap levels in a substrate such as of Si by Deep Level Transient Spectroscope.

BRIEF DESCRIPTION OF THE DRAWINGS

FIGS. 2b and 2c are sectional and plan views showing a principal part of the device shown in FIG. 2a.

FIG. 3 is an equivalent circuit diagram of the power IG FET in the device shown in FIG. 2a.

DESCRIPTION OF EMBODIMENTS

Figure 2A:
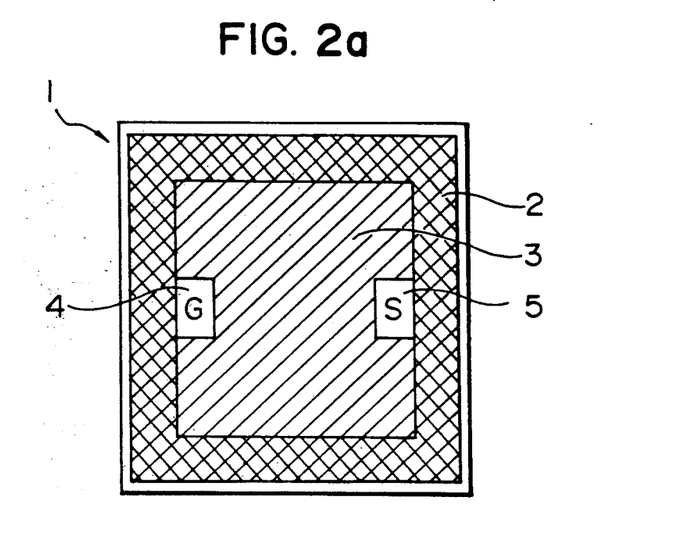
FIG. 2a is a schematic plan view of a semiconductor device including a power IG FET according to an embodiment of the present invention.
Figure 2B:
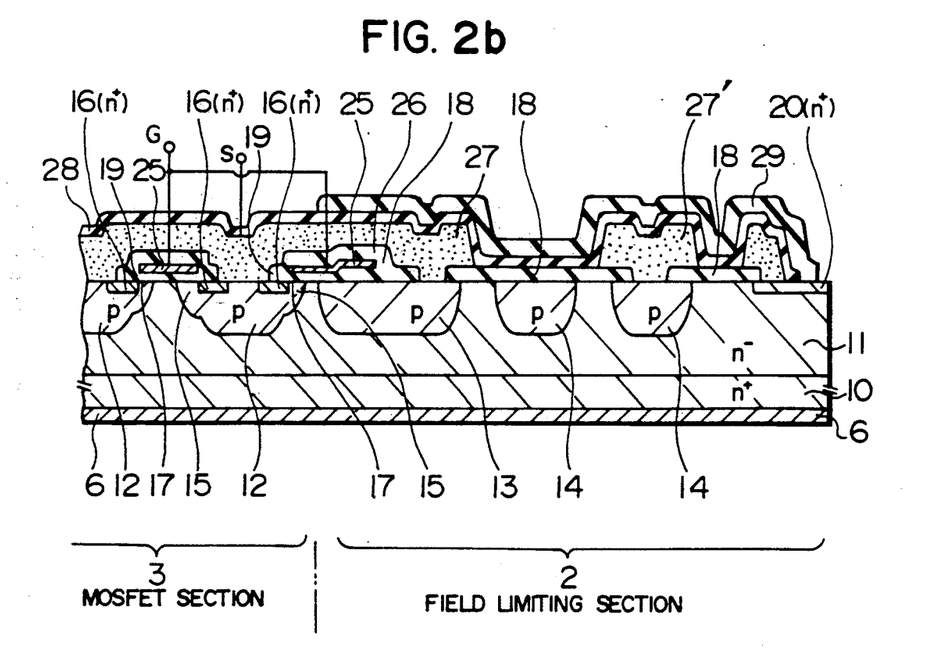
Figure 2C:
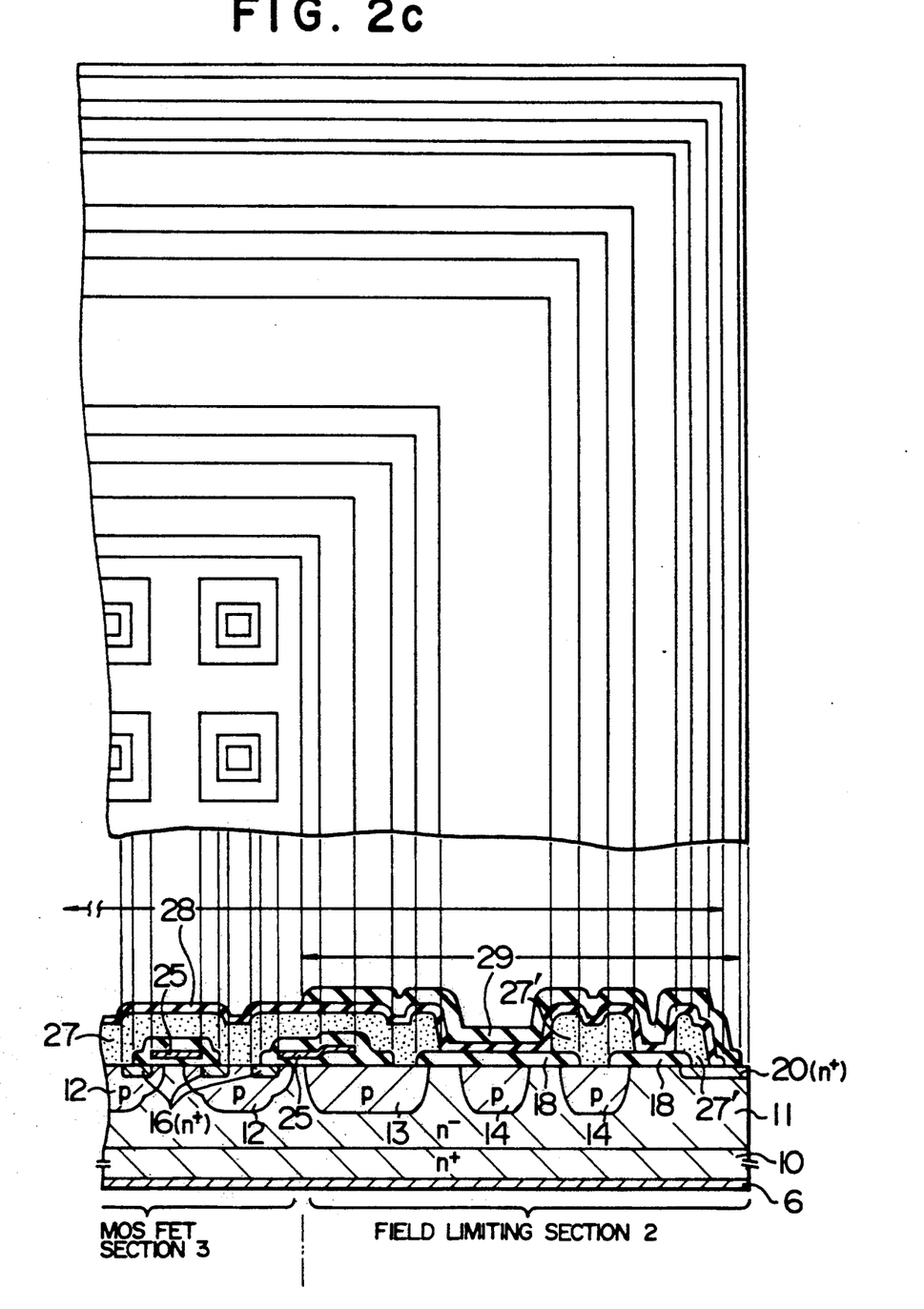
Figure 3:
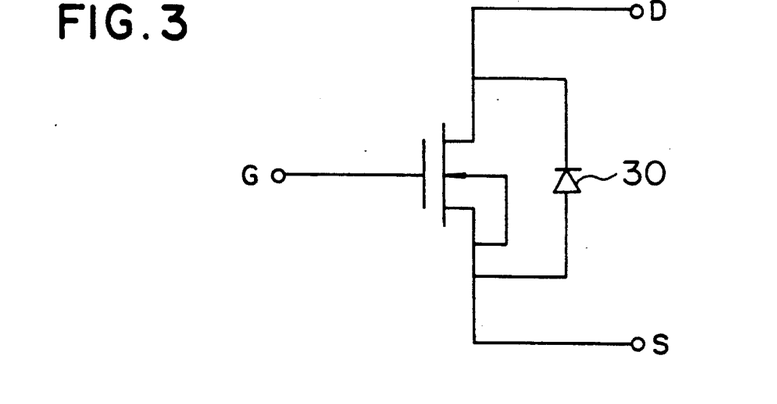
Figure 4:
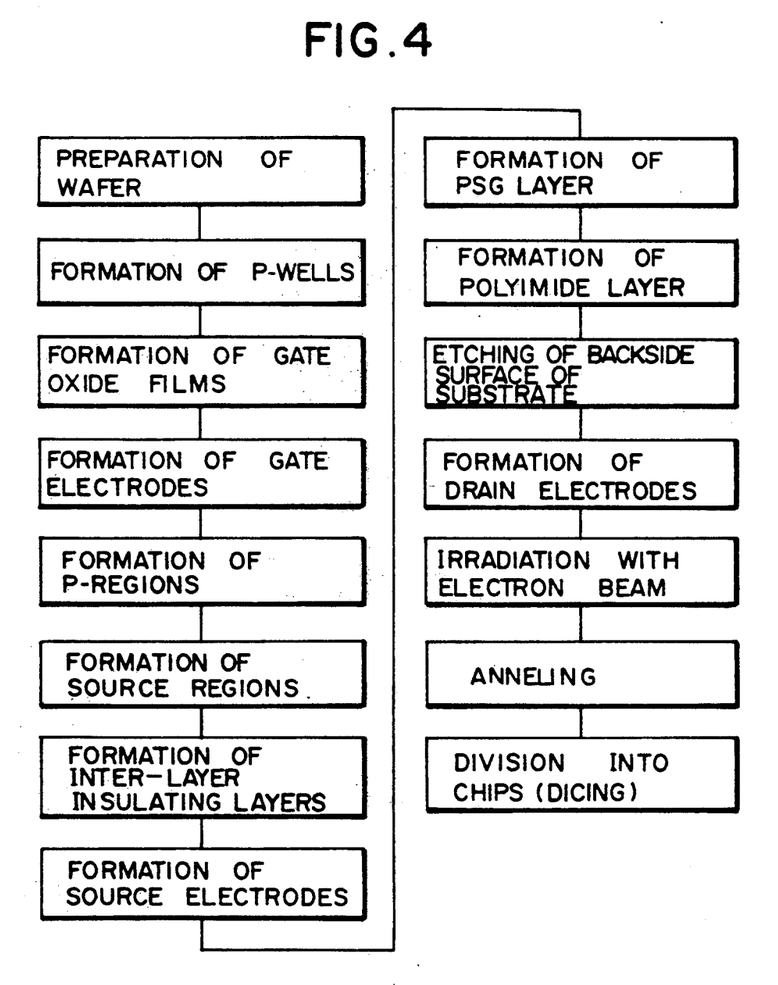
FIG. 4 is a flow chart showing manufacturing steps for a semiconductor device including a power IG FET which may be employed in an embodiment of the present invention.

FIG. 2a is a schematic plan view of a semiconductor device including a power IG FET such as a power MOSFET according to an embodiment of the present invention, FIGS. 2b and 2c are sectional and plan views showing a principal part of the semiconductor device, and FIG. 3 is an equivalent circuit diagram of the power MOSFET.

A semiconductor device (semiconductor chip) 1 including a power MOSFET is formed in a rectangular plate structure having a fixed thickness as shown in FIG. 2a. The semiconductor device 1 has, at its periphery shown with cross-hatching, a peripheral section 2 or a field limiting region 2 and, in the region shown with hatching inside the field limiting region 2, a MOSFET section 3 where a plurality of vertical MOSFETs cells are formed as seen on a plane level. In this MOSFET section 3, a plurality of vertical MOSFET cells are formed in rows and columns, which will be described layer. Further, blank blocks at the central portions of both ends of the MOSFET section 3 are a wire bonding pad 4 for a gate (G) and a wire bonding pad 5 for a source (S), respectively. In addition, although not shown in the figure, the back side surface of the chip 1 is provided with a drain electrode 6 (see FIG. 2b).

The semiconductor element 1 has a structure as shown in FIGS. 2b and 2c, in which a sectional view showing a part of the semiconductor device 1 having a plurality of vertical n-channel MOSFET cells (insulated gate field-effect transistor cells) arranged in rows and columns at the central portion thereof. A region on the left side of a two-dot chain line is the central portion of the semiconductor device 1 where the MOSFET section 3 is formed, and a region on the right side is the peripheral section of the semiconductor device 1 which is the field limiting region 2.

As shown in FIGS. 2b and 2c, such vertical power MOSFET cells having p-type wells 12 about 8–10 $\mu$m deep are formed in a first surface portion of n$^-$ type epitaxial growth layer 11 formed on an n$^+$ type silicon (Si) semiconductor substrate 10 having a thickness of approximately 400 $\mu$m. The n$^-$ type epitaxial growth layer 11 has a thickness selected depending on the withstand voltage, and may have a thickness of about 10 to 50 $\mu$m. In a second surface portion of the n$^-$ type epitaxial growth layer 11, p-type wells 13, 14 having a depth of about 8 to 10 $\mu$m are formed simultaneously with the p-type wells 12. The first and second surface portions of the layer 11 almost correspond to surface portions of the above-mentioned MOSFET section 3 and field limiting section 2, and therefore, the second surface portion substantially surrounds the first surface portion. Those wells include a plurality of wells 12 for cells for constituting FET cells in the MOSFET section 3, a p-type region 13 which is disposed in the peripheral section 2 and acquires a potential almost equal to the wells 12 in operation, and two field limiting rings (FLRs) 14 provided outside the p-type regions 13 in the peripheral section 2. A signal FLR may be employed as the case demands.

Furthermore, in the surface layer portions of said wells 12 for cells, p-type regions 15 are provided in a projecting manner from the peripheral ends of these wells 12. These p-type regions 15 have a depth of about 3 to 4 $\mu$m. In the surface layer portions of said wells 12, at least one source region, here, one source region 16 of n$^+$ type having a depth of about 1 $\mu$m in a ring form is provided. Gate electrodes 25 are formed over the surface layer portions of the p-type regions 15 so as to be electrically insulated therefrom so that the surface layer portions of p-type regions 15 between the source regions 16 and the substrate 11 form channels 17 of the MOSFET cells. Furthermore, on said semiconductor substrate 11, thick field insulating layers (field oxide layers) 18 each composed of an insulating (SiO$_2$) layer and a phosphosilicate (PSG) layer and having a thickness of about 1 to 2 $\mu$m and thin gate insulating layers (gate oxide layers) 19 made of SiO$_2$ having a thickness of about 1,000 Å continuous from the layer 18 are provided. Above-mentioned field oxide layers 18 extend over the p-type region 13 and the field limiting ring 14. Further, the gate oxide layer 19 for the outermost well 12 extends over to the p-type region 13. Further, at the outermost portion of the field limiting region 2, an n+ type annular ring (a gurd ring) 20 having a depth of about 1 μm is provided. This annular ring 20 is formed simultaneously with formation of said source regions 16.

On the other hand, polycrystalline silicon layers 25 having a thickness of 4,500 Å are provided on the gate oxide films 19 and a part of the field oxide layers 18 extending therefrom. These polycrystalline silicon layer 25 become gate electrodes. Furthermore, said polycrystalline silicon layers 25 are covered with inter-layer insulating layers 26. These inter-layer insulating layers 26 also cover the inside surface portions of the source regions 16.

Further, source electrodes 27 made of Al having a thickness of 3 to 4 μm are provided on the first surface portion of the n− type epitaxial growth layer 11, that is, the surface portion of the MOSFET section 3 so that the electrodes 27 are in contact with the source regions 16 and p-type well 12. Similarly, Al layers 27' of a thickness of 3 to 4 μm are provided so as to be in contact with the outermost FLR well 14 and the annular ring 20. The Al electrode 27 extends onto the p-type region 13.

A phosphosilicate glass (PSG) layer 28 having a thickness of about 1 μm is formed on the substantial area or the whole area of the principal surface of the semiconductor device 1. Further, a polyimide resin film 29 having a thickness of 3 to 4 μm is provided on the surface of a region of the device except for at least the MOSFET section 3, for example, on the surface of the field limiting region 2. The PSG layer 28 and polyimide resin layer 29 constitute passivation layers. Furthermore, a drain electrode 6 made of silver having a thickness of about 1 μm is provided on the back side surface of the semiconductor device 1. This semiconductor device 1 has an equivalent circuit such as shown in FIG. 3.

Such a semiconductor device 1 forms a built-in diode 30 between the n− type epitaxial growth layer 11 and the p-type wells 12 for cells as shown in FIG. 3, and a lifetime control treatment such as electron beam irradiation and annealing treatment are applied in order to reduce the reverse recovery time $t_{rr}$ of this built-in diode 30. Such irradiation with electron beam and annealing treatment are performed when a final heat treatment is effected in the manufacture. In addition, the passivation layer being formed with polyimide resin in this semiconductor device 1, adhesion with resin is increased when molded with resin, thereby to improve moisture resistance. Since this polyimide resin coat is not preferable from the viewpoint of recovery from a decreased threshold voltage $V_{th}$ of the MOSFET at the time of annealing treatment after the electron beam irradiation, the polyimide resin layer 29 is provided in the field limiting region 2 and is not provided in the MOSFET section 3 in the present embodiment. Accordingly, even for a semiconductor device in which the passivation layer is made of a polyimide resin, it is possible to reduce or shorten the reverse recovery time of the built-in diode and to recover the threshold voltage value of the MOSFET by means of electron beam irradiation and annealing treatment.

A manufacturing method of the semiconductor device 1 will be described with reference to FIG. 4 and FIG. 5a to FIG. 5i. As shown in the flow chart of FIG. 4, the semiconductor device 1 may be manufactured through respective steps of preparation of a wafer, formation of p-wells, formation of gate oxide films, formation of gate electrodes, formation of p-regions, formation of source regions, formation of inter-layer insulating layers, formation of source electrode, formation of PSG layers, formation of a polyimide layer, etching of the back side surface of the substrate, formation of a drain electrode, electron beam irradiation, annealing, and division into chips (dicing).

Figure 5A:
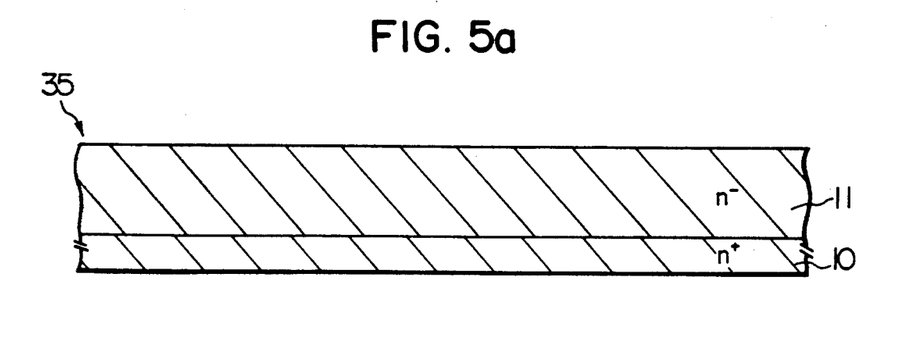
FIGS. 5a to 5i are sectional views of a part of a wafer showing various stages of manufacture of the power IG FET according to an embodiment of the present invention.

As shown in FIG. 5a, an n+ type semiconductor substrate 10 having a thickness of approximately 500-600 μm provided with an n− type epitaxial growth layer 11 on the principal plane thereof is prepared first. This semiconductor substrate 10 is hereafter referred to as a wafer 35 because it is thin and has a relatively large diameter.

Figure 5B:
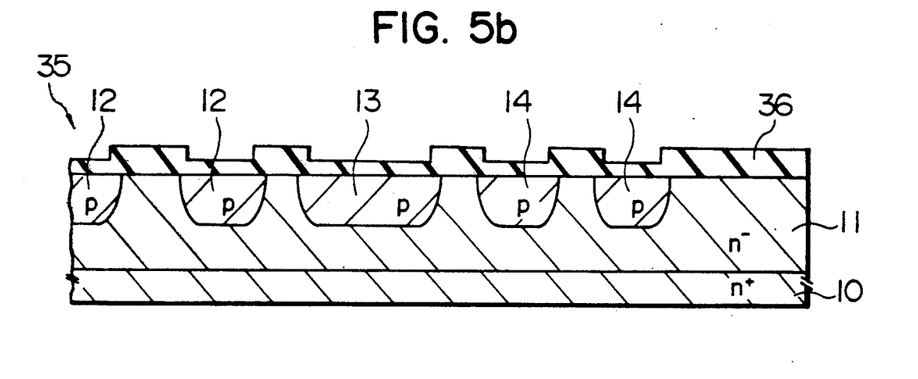

Next, as shown in FIG. 5b, on the principal surface of the wafer 35, a SiO$_2$ film 36 is partly formed by means of thermal oxidation and wells having a depth of 8 to 10 μm are formed by means of ion implantation of boron and annealing treatment. These wells are grouped into three, the wells 12 for FET cells, the p-type region 13 and the field limiting rings 14. The wells 12 are provided in the MOSFET section 3. A plurality of these wells 12 for FET cells are arranged spot-wise in rows and columns in the MOSFET section 3. The pitch between the wells 12 is about 30 to 40 μm. In the field limiting region 2, the p-type region 13 is provided inside thereof and field limiting rings 14 are provided in two stages outside thereof.

Figure 5C:
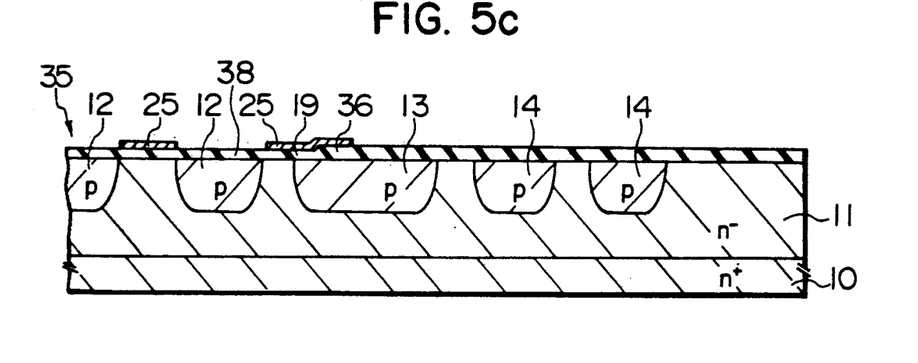

Next, the SiO$_2$ layer 36 is removed partially by etching. Thereafter, as shown in FIG. 5c, an oxide layer 38 is formed by thermal oxidation on the principal surface of the wafer 35. This oxide layer 38 partially becomes gate oxide layers (gate insulating layers) 19. This oxide layer 38 has a thickness of 1,000 Å. Further, polycrystalline silicon layers 25 are formed partially covering the oxide layer 38 and extending from the oxide layer 38 to the SiO$_2$ layer 36. These polycrystalline silicon layers 25 partially become gate electrodes.

Figure 5D:
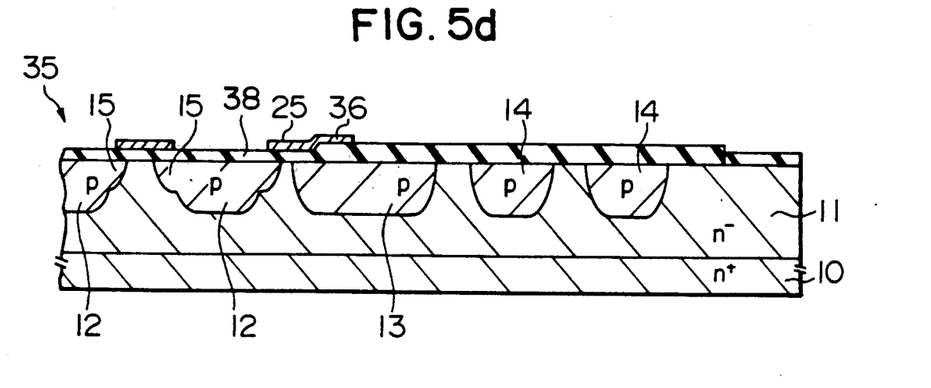

Next, boron is implanted into the surface of the n− type epitaxial growth layer 11 with the polycrystalline silicon layers 25, SiO$_2$ layer 36 and a photoresist film not shown used as a mask and annealing treatment is applied. As the result, as shown in FIG. 5d, p-type regions 15 having a depth of 3 to 4 μm are formed at the periphery of the wells 12 for FET cells.

Figure 5E:
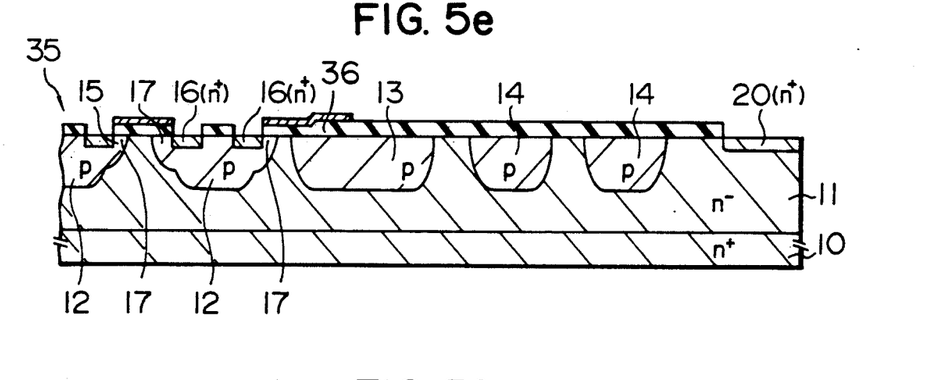

Next, as shown in FIG. 5e, regions in the oxide layer 38 under which source regions are to be formed and under which an annular ring is to be formed at the outermost periphery of the field limiting region 2, respectively, are removed. Then, phosphorus is implanted and annealing treatment is applied. As the result, n+ type source regions 16 are formed in the surface layer portions of the wells 12, and the annular ring 20 is also formed in the field limiting region 2. These n+ type regions have a depth of about 1 μm. The p-type region 15 portions outside the source regions 16 form channels 17. Since the source regions 16 and p-type regions 15 are formed by ion implantation mainly with the poly silicon layers 25, which are to serve as gate electrodes, used as a mask for impurity introduction, respectively, and therefore, they are self-aligned to the gate electrodes, and channels 17 have accurate dimensions.

Namely, the dimensions for the channels are determined by a difference of the diffusion coefficient between boron and phosphorus.

Figure 5F:
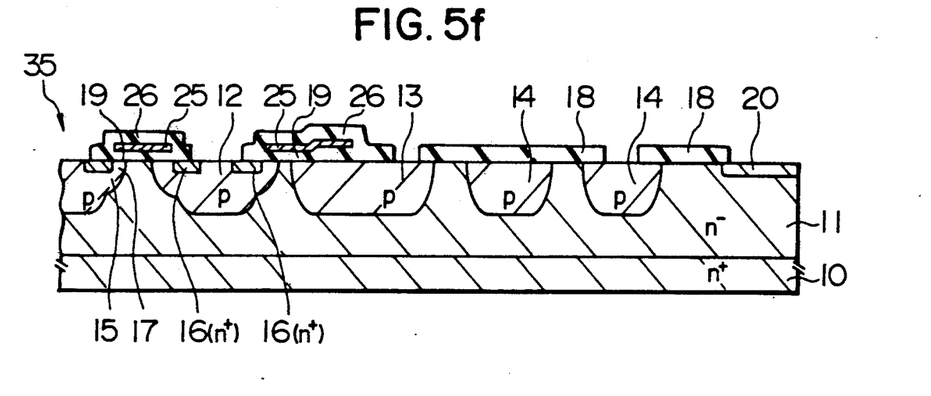

Next, as shown in FIG. 5f, unnecessary oxide layers 38 are removed, and inter-layer insulating layers made of PSG are newly formed partially on the principal surface of the wafer 35. As the result, the poly silicon layers 25 which are to serve as the gate electrodes are covered by the inter-layer insulating layers 26. Under this state, the wells 12 including source regions 16, a part of the p-type region 13, a part of the outermost field limiting rings 14, and the outermost peripheral portion of the field limiting region 2 are exposed.

Figure 5G:
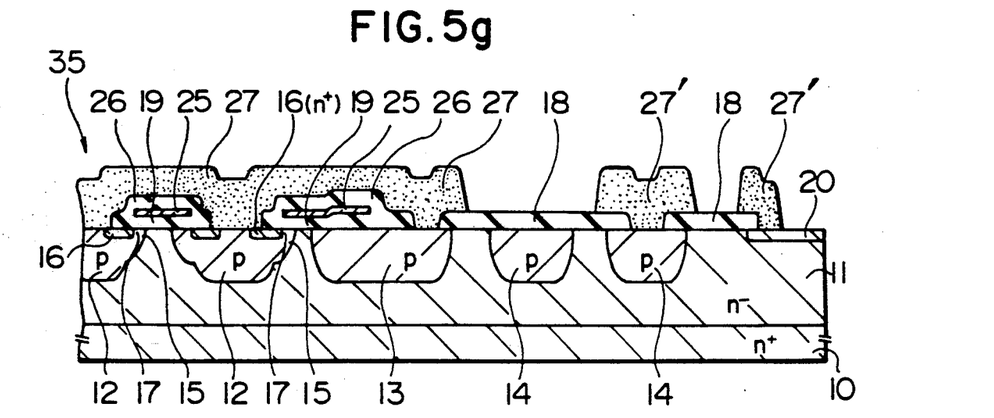

Next, as shown in FIG. 5g, source electrodes 27 and conductor layers 27' which are in contact with the exposed portions, respectively, are provided. These source electrodes 27 and conductor layers 27' are made of Al each having a thickness of 3 to 4 μm, and are subjected to patterning by means of evaporation and usual etching as shown in FIG. 5g. These source electrodes 27 are in electrical contact with the source regions 16, p-type wells 12 and p-type region 13.

Figure 5H:
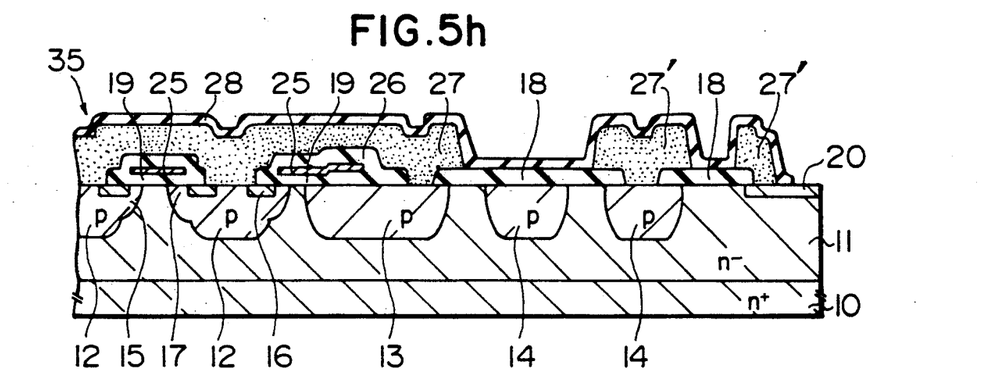

Next, as shown in FIG. 5h, a layer 28 of an inorganic material, e.g., of PSG having a thickness of about 1 μm is formed on the principal surface of the wafer 35. In this embodiment, the PSG layer 28 covers the peripheral section or the field limiting region 2 as well as the MOSFET section 3.

Figure 5I:
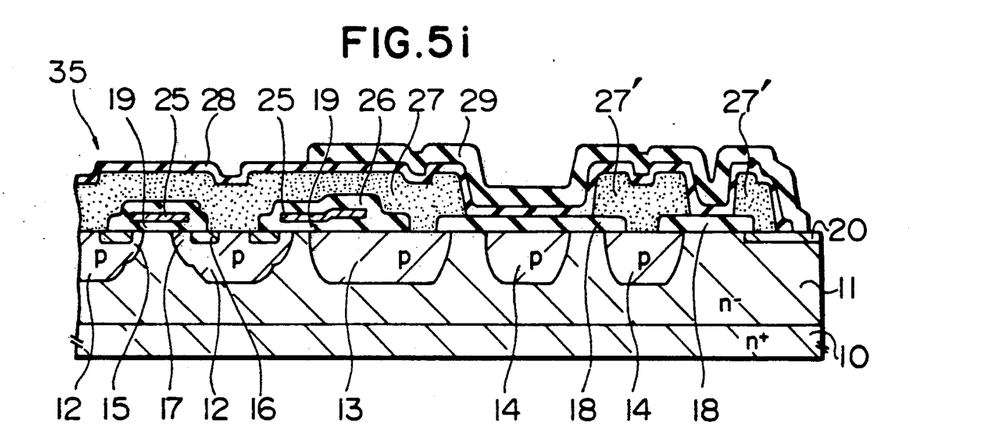

Next, as shown in FIG. 5i, a layer 29 of an organic material, e.g., of a polyimide resin having a thickness of 3 to 4 μm is formed on the PSG layer on the field limiting region 2.

Next, the back side surface of the wafer 35 is etched. Then, on the etched back side surface of the wafer 35, a drain electrode 6 made of silver having a thickness of about 1 μm is formed as shown in FIG. 2b.

Next, an electron beam is radiated onto and annealing treatment is applied to the whole area of this wafer 35. The conditions of the electron beam irradiation are such that particles of $1 \times 10^{15}$ cm$^{-2}$ are radiated with an energy of 1 to 2 MeV. Further, annealing is performed for about 60 minutes at 300° to 400° C. Lifetime killer is formed in the substrate by the electron beam irradiation, and the reverse recovery time $t_{rr}$ of the built-in diode is reduced. For example, the reverse recovery time $t_{rr}$ of a built-in diode may be reduced from normally about 500 ns to 100 to 110 ns, and thus, the built-in diode becomes usable as a flywheel diode.

Figure 6:
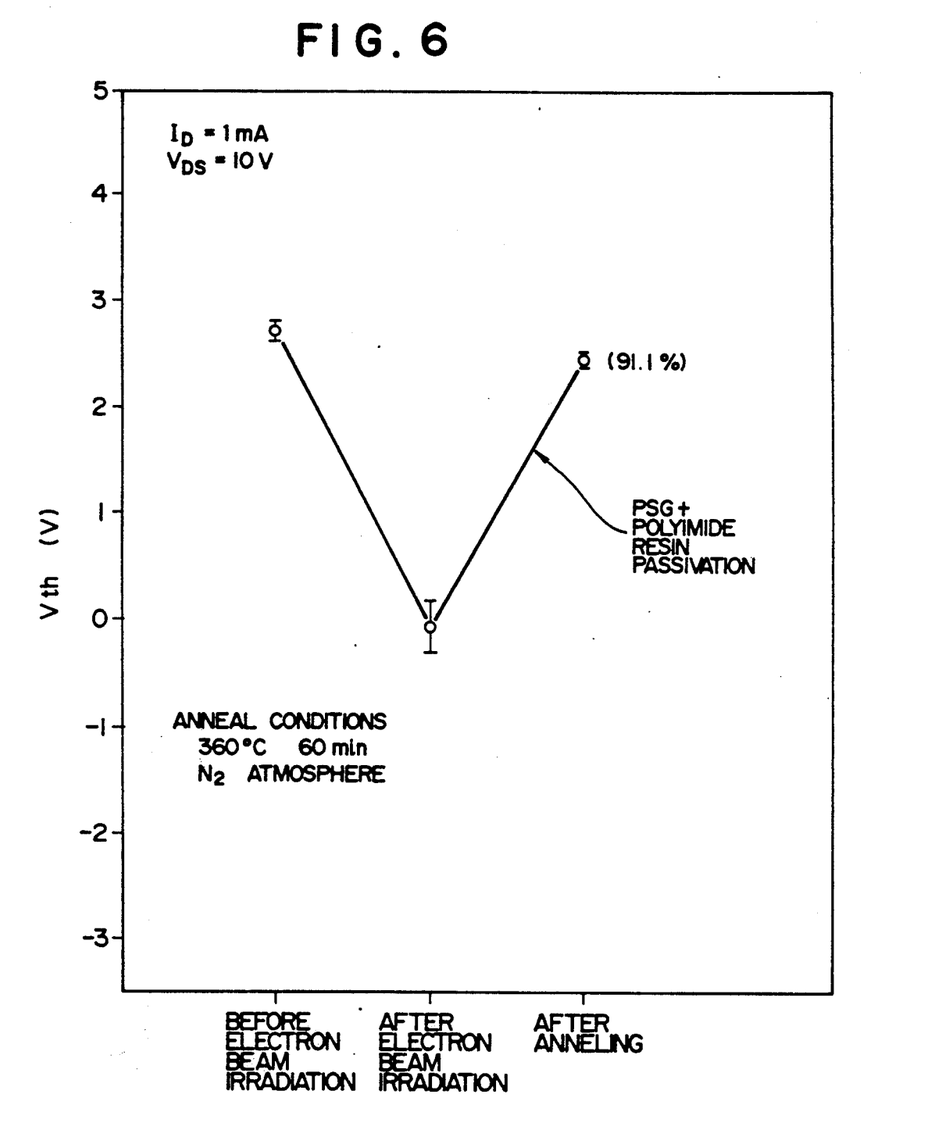
FIG. 6 is a graph showing effects semiconductor devices according to an embodiment of the present invention.

Further, the threshold voltage $V_{th}$ of the MOSFET is undesirably decreased by the electron beam irradiation, but is recovered, by shown in FIG. 6, by the annealing treatment to about 80 to 90% of the threshold voltage $V_{th}$ as compared to the case in which electron beam irradiation is not applied. Here, in such recovery, the rate of recovery of the threshold voltage $V_{th}$ is as low as 50 to 68% when the MOSFET section is covered with polyimide resin, but the recovery rate of the threshold voltage $V_{th}$ is increased to as high as 80 to 90% in the case of the present embodiment in which the MOSFET section 3 is covered with the PSG layer 28 and not covered with a polyimide resin layer 29.

Next, the wafer 36 is divided longitudinally and latitudinally, thereby to manufacture a plurality of semiconductor devices 1 such as shown in FIG. 2a.

Besides, electron beam irradiation and annealing treatment for reducing the reverse recovery time $t_{rr}$ of the built-in diode should be performed in the final process after the MOSFET section is formed, the passivation layers and respective electrodes are formed and before the wafer 35 is divided, because the reverse recovery time would be undesirably made longer if heat is applied to the device after the electron beam irradiation and annealing. That is, the electron beam irradiation and annealing treatment should be performed after the final process attended by heat generation.

Figure 7:
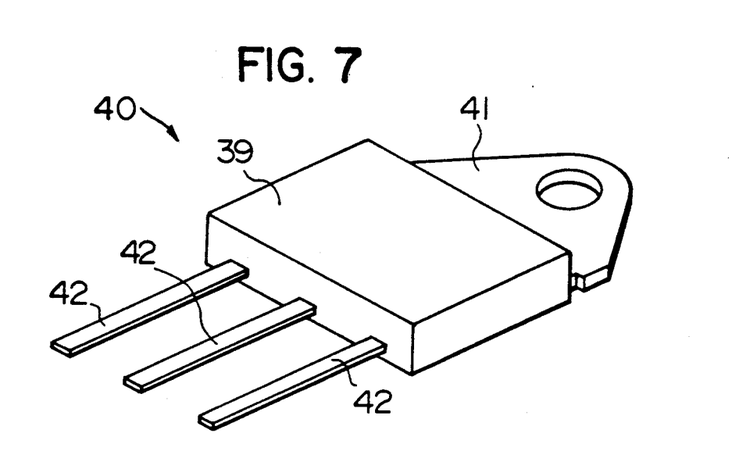
FIG. 7 is a perspective view of a packaged semiconductor device according to an embodiment of the present invention.

Such a semiconductor device 1 is incorporated into a package 39 as shown in FIG. 7, thus forming a packaged semiconductor device 40. Although it is not specifically shown, a lead frame is used in assembling this packaged device 40, and the semiconductor device 1 is fixed onto a header 41 of this lead frame. Further, the electrodes of the fixed semiconductor device 1, in other words, the wire bonding pad 4 for the gate, the wire bonding pad 5 for the source, and leads 42 of the lead frame corresponding thereto are connected with conductive wires not shown, and a part of the header 41, the semiconductor device 1, internal ends of the leads 42, wires and the like are sealed (molded) with insulating resin such as epoxy resin. Further, unnecessary lead frame portions are cut and removed after molding, thus providing the packaged semiconductor device 40 as shown in FIG. 7. In this molding, the peripheral section of the semiconductor device 1, that is, the field limiting region 2 is covered with resin (polyimide resin) having good adhesion with resin. Therefore, good adhesion between the resin and the semiconductor device 1 is achieved and moisture resistance is improved.

According to such this embodiment, the following effects are obtainable.

(1) A polyimide resin which shows good adhesion with resin for forming a package is provided in a field limiting region of a semiconductor device. Thus, moisture resistance is enhanced.

(2) A polyimide resin is used as a passivation layer, which is unsatisfactory from the viewpoint of the recovery of the threshold voltage $V_{th}$ of the MOSFET from a lowered level undesirably caused by electron beam irradiation and annealing treatment for controlling the reverse recovery time $t_{rr}$ of a built-in diode. The polyimide passivation is provided for region other than the MOSFET section, and a PSG film having good recoverability of the threshold voltage $V_{th}$ is used as the surface passivation of the MOSFET section. Therefore, such an effect that reduction of the reverse recovery time $t_{rr}$ of the built-in diode and smooth recovery of the threshold voltage $V_{th}$ of the MOSFET may be achieved.

(3) With above-described effect (2), such an effect that a built-in diode may be used as a flywheel diode is obtainable in the semiconductor device.

(4) With above-described effects (1) thru (3), it is possible to provide a MOSFET for high speed switching.

Figure 8:
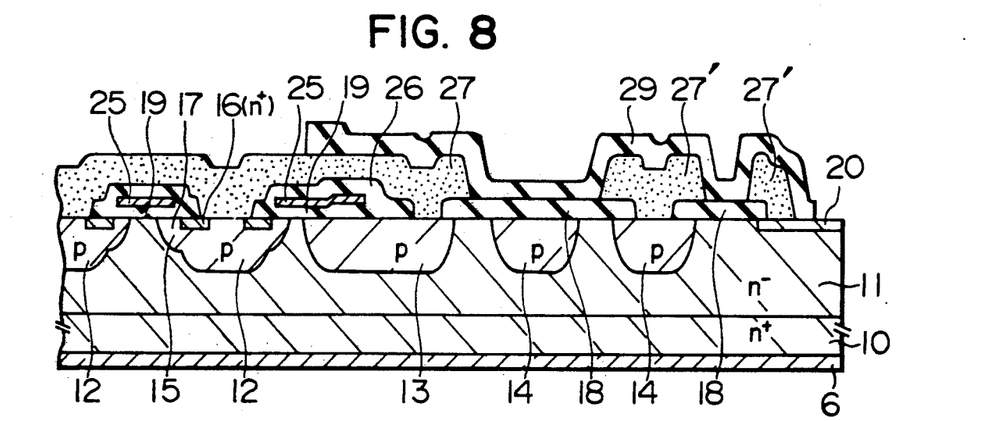
FIG. 8 is a sectional view showing a principal part of a semiconductor device including a power IG FET according to another embodiment of the present invention.

The present invention has been specifically described above in connection with some embodiments. However, it is a matter of course that the present invention is not limited to above-described embodiments, but may be modified in various manners within the scope of the appended claims without departing from the gist thereof. For example, similar effects to above-described embodiment are obtainable with a structure in which a passivation layer 29 made of a polyimide resin is not provided in the MOSFET section 3 so as to expose the source electrodes 27, and is provided only in the field limiting region 2 as shown in FIG. 8.

Figure 9:
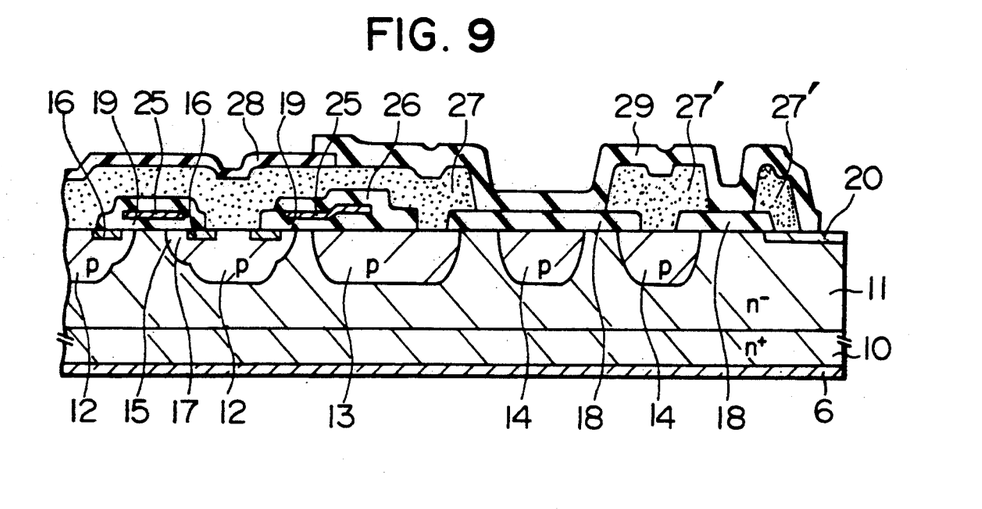
FIG. 9 is a sectional view showing a principal part of a semiconductor device including a power MOSFET according to still another embodiment of the present invention.

Furthermore, as shown in FIG. 9, a polyimide resin layer 29 is provided as the passivation layer for the field limiting region 2 and a PSG film 28 is provided for the MOSFET section 3, whereby the effects of lifetime control by electron beam irradiation and the recovery of the threshold voltage $V_{th}$ of the MOSFET by annealing treatment are obtained by the specific provision of different passivation layers.

In above description, the present invention has been explained with respect to a case in which the invention is applied to a vertical MOSFET referred to in the background thereof, but the present invention is not limited to that case. For example, the present invention may be applied to insulated gate bipolar transistors (IGBT).

The present invention is applicable to at least a semiconductor device having a built-in diode.

We claim:

1. A method of manufacturing semiconductor devices comprising the steps of:
    preparing a semiconductor substrate of a first conductivity type;
    forming a plurality of first doped regions of a second conductivity type and at least one second doped region of said second conductivity type in first and second surface portions of said substrate, respectively, said first surface portion being generally located centrally of said substrate while said second surface portion is generally located peripherally of said substrate to substantially surround said first surface portion;
    forming a first conductor layer over a part of each of said first doped region, each first conductor layer being electrically insulated from its associated part of the first doped region;
    forming at least one third doped region of said first conductivity type in each of said plurality of first doped regions;
    forming a second conductor layer and a fourth conductor layer on said first and second surface portions of said substrate, respectively, so that said second conductor layer is in contact with said first and third doped regions and is electrically insulated from said first conductor layers and that said fourth conductor layer is in contact with said second doped region;
    forming a passivation layer of an organic material to cover said second surface portions of said substrate, but not cover said first surface portion of said substrate;
    forming a third conductor layer on a surface of said substrate which is opposite to said first and second surface portions, said first, second and third conductor layers, said first and third doped regions, and said substrate constituting a field-effect transistor;
    treating said first surface portion of said substrate, which is not covered with said passivation layer, with a treatment for decreasing lifetime of carriers in said substrate which may cause an undesirable decrease of a threshold voltage of said field-effect transistor; and
    annealing said first surface portion of said substrate, which is not covered with said passivation layer, to thereby recover said threshold voltage of said field-effect transistor.

2. A method according to claim 1, which said organic material is a polyimide resin.

3. A method according to claim 1, further comprising the step of forming, before said formation of said passivation layer of an organic material, another passivation layer of an organic material on said second conductor layer to cover at least said first surface portion of said substrate.

4. A method according to claim 3, in which said organic material is a polyimide resin and said inorganic material is phosphosilicate glass.

5. A method according to claim 4, in which said another passivation layer of phosphosilicate glass is formed to cover said first and second surface portions of said substrate, and said passivation layer of a polyimide resin is formed to cover said second surface portion of said substrate.

6. A method according to claim 1, further comprising the step of molding the assembly obtained after said annealing step with a resin to provide a packaged semiconductor device.

7. A method according to claim 1, in which said treatment for decreasing lifetime of carriers is effected by irradiating said assembly with an electron beam.

8. A method of manufacturing a semiconductor device having a MOSFET comprising the steps of:
    (a) preparing a semiconductor substrate of a first conductivity type;
    (f) forming said MOSFET with a first doped region of a second conductivity type, which is opposite said first conductivity type, on a first surface portion of said substrate, said first doped region and said substrate forming a PN junction in said substrate;
    (c) forming a second doped region of said second conductivity type on a second surface portion of said substrate, as a field limiting region, said first surface portion being generally located centrally of said substrate while said second surface portion is generally located peripherally of said substrate to substantially surround said first surface portion, wherein said field limiting region is for preventing a depletion layer which generates in said substrate at said PN junction from expanding to an edge of said semiconductor substrate;
    (d) forming a passivation layer of an organic material over said second surface portion of said substrate to cover said second doped region, but not cover said first surface portion of said substrate;
    (e) irradiating said MOSFET with an electron beam to reduce reverse recovery time of a built-in diode defined by said PN junction; and
    (f) heat treating said MOSFET to recover the threshold voltage of said MOSFET which may have been decreased as a result of irradiation with said electron beam.

* * * * *